United States Patent [19]
Shah

[11] Patent Number: 5,970,382
[45] Date of Patent: Oct. 19, 1999

[54] PROCESS FOR FORMING COATINGS ON SEMICONDUCTOR DEVICES

[75] Inventor: Nitin B. Shah, San Jose, Calif.

[73] Assignee: AG Associates, San Jose, Calif.

[21] Appl. No.: 09/013,247

[22] Filed: Jan. 26, 1998

[51] Int. Cl.[6] .......................... H01L 21/31; H01L 21/469
[52] U.S. Cl. .......................... 438/775; 438/758; 438/765
[58] Field of Search .................................. 438/775, 765, 438/758

[56] References Cited

U.S. PATENT DOCUMENTS

| | | |
|---|---|---|
| 4,938,857 | 7/1990 | Gillery . |
| 5,256,455 | 10/1993 | Numasawa . |
| 5,376,593 | 12/1994 | Sandhu et al. . |
| 5,445,999 | 8/1995 | Thakur et al. . |

Primary Examiner—Kevin M. Picardat
Assistant Examiner—D. Mann Collins
Attorney, Agent, or Firm—Dority & Manning, P.A.

[57] ABSTRACT

A process for forming coatings and films from a gaseous reactant onto a semiconductor device is disclosed. The process includes preheating a gas to a temperature so that the gas will immediately react with the semiconductor wafer. After being preheated, the gas is contacted with the wafer under controlled conditions in order to form a uniform film. For instance, in one embodiment, a gas containing dinitrogen oxide is preheated until the dinitrogen oxide disassociates into nitric oxide. The nitric oxide is then contacted with the wafer to form an oxide coating. In an alternative embodiment, gaseous hydrogen and oxygen are preheated to a temperature sufficient to form steam, which subsequently chemically reacts with the wafer.

29 Claims, 2 Drawing Sheets

PROCESS FOR FORMING COATINGS ON SEMICONDUCTOR DEVICES

FIELD OF THE INVENTION

The present invention generally relates to a process for forming coatings on semiconductor devices, such as silicon wafers. The coatings are formed by first preheating a gas or gases to form a product gas and then reacting the product gas with the wafer. For instance, in one embodiment, a gas containing dinitrogen oxide is preheated to a temperature sufficient to form nitric oxide which is subsequently reacted with a surface of a silicon wafer.

BACKGROUND OF THE INVENTION

A thermal processing chamber as used herein refers to a device that rapidly heats objects such as semiconductor wafers. Such devices typically include a substrate holder for holding a semiconductor wafer and a light source that emits light energy for heating the wafer. During heat treatment, the semiconductor wafers are heated under controlled conditions according to a preset temperature regime. For monitoring the temperature of the semiconductor wafer during heat treatment, thermal processing chambers also typically include radiation sensing devices, such as pyrometers, that sense the radiation being emitted by the semiconductor wafer at a selected wavelength. By sensing the thermal radiation being emitted by the wafer, the temperature of the wafer can be calculated with reasonable accuracy.

Many semiconductor heating processes require a wafer to be heated to high temperatures so that various chemical and physical transformations can take place. For instance, semiconductor wafers are typically heated to temperatures of from about 400° C. to about 1200° C., for times which are typically less than a few minutes. During heat treating, one main goal is to heat the wafers as uniformly as possible. During some applications, a gas or gases can be circulated through the thermal processing chamber as the semiconductor wafer is being heat treated. The gas or gases can contain or can be converted to a gaseous reactant which is designed to react with the surface of the semiconductor wafer in order to form a film or coating on the wafer. For instance, the film or coating can be applied to the wafer in order to produce a semiconductor device having desired properties.

For example, in one particular application, a gas containing dinitrogen oxide is fed to a thermal processing chamber containing a semiconductor device in order to form an oxide coating on the surface of the semiconductor device. More particularly, as the gas is fed to the thermal processing chamber, the dinitrogen oxide increases in temperature due to exposure to the heat source in communication with the chamber and due to contact with the wafer itself. When the dinitrogen oxide reaches a certain temperature, the compound disassociates forming nitric oxide which reacts with silicon contained within the wafer to form silicon oxynitride.

In the past, various problems have been experienced in attempting to form films and coatings on semiconductor wafers according to the above-described process. For instance, since the gas or gases entering the thermal processing chamber must be heated before a reaction will occur with a semiconductor device, the process proceeds at a relatively slow rate which limits the speed at which the semiconductor devices can be fabricated.

Another problem that has been experienced in the past is the ability to form a coating on the semiconductor wafer that has a uniform thickness. For example, since the gas must be heated prior to reaction with the wafer, more reaction occurs at the far end of the wafer than at the end of the wafer that first contacts the gas. In some systems, the wafer is rotated during the process in order to promote a more uniform reaction with the gas over the surface of the wafer. Rotating the wafer, however, does not completely cure the above deficiencies and thus problems are still experienced in forming a coating or film having a uniform and controlled thickness.

Another problem experienced in thermal processing chambers in which a gas is circulated is the cooling effect the gas has on the semiconductor wafer. In particular, as the wafer is exposed to the flow of gas, increased convective cooling may occur over the surface of the wafer and along its edges, particularly where the gas first contacts the wafer. Ultimately, these energy losses can create different temperature zones within the wafer, which adversely impacts upon the heat treatment process and upon the quality of the final product.

For illustrative purposes, referring to FIG. 1, a schematic diagram of a conventional thermal processing chamber generally (10) is shown. Thermal processing chamber (10) includes a plurality of light sources (12) for heating a semiconductor wafer (14). As shown, a gas to be reacted with wafer (14) is fed through a gas inlet and over the surface of the wafer.

The gas is introduced into thermal processing chamber (10) at a temperature $T_i$ which is below the temperature at which the gas will react with the wafer. As the gas flows over the wafer, the gas increases in temperature until it reaches a critical temperature $T_c$ necessary for reaction with the wafer to occur. For instance, if the gas being circulated through the chamber contains dinitrogen oxide, the critical temperature is the temperature at which the dinitrogen oxide disassociates into nitric oxide.

As shown in the figure, typically the gas is not heated to its critical temperature until the gas has already traveled a substantial distance over the surface of the wafer. Thus, most of the reaction occurs at the far end of the wafer resulting in a coating having an uneven thickness. Also, as described above, the gas circulating through the chamber can cool the wafer and prevent the wafer from being heated uniformly.

In view of the above deficiencies and drawbacks of prior art constructions, currently, a need exists for a method of uniformly coating semiconductor wafers using a gaseous reactant. A need further exists for a method of coating semiconductor wafers with a gaseous reactant without adversely affecting the heat treating process.

SUMMARY OF THE INVENTION

The present invention recognizes and addresses the foregoing disadvantages, and others of prior art constructions and methods.

Accordingly, it is an object of the present invention to provide an improved process for coating semiconductor wafers in thermal processing chambers.

It is another object of the present invention to provide a process for reacting a gas with a semiconductor wafer in a thermal processing chamber.

It is another object of the present invention to provide a method for coating a semiconductor wafer using a gaseous reactant wherein the gaseous reactant is preheated or a precursor gas is preheated prior to being contacted with the wafer.

Still another object of the present invention is to provide an improved process for applying an oxide coating to a semiconductor wafer that is formed by reacting the wafer with nitric oxide.

Another object of the present invention is to provide an improved thermal processing chamber that includes a device adapted to preheat a gas entering the chamber.

It is still another object of the present invention to provide a process for coating a semiconductor wafer with an oxynitride by first preheating a gas containing dinitrogen oxide to a temperature sufficient to form nitric oxide and then contacting the heated gas with the semiconductor wafer.

These and other objects of the present invention are achieved by providing a process for forming an oxynitride coating on a semiconductor device. The process includes the steps of placing a semiconductor wafer in a thermal processing chamber. The semiconductor wafer is heated in the chamber by using light energy. A gas containing dinitrogen oxide is preheated to a temperature sufficient to convert a substantial portion of the dinitrogen oxide into nitric oxide. Once preheated, the gas is contacted with the semiconductor wafer while the wafer is being heated by the light energy. The nitric oxide contained within the preheated gas, is reacted with the semiconductor wafer to form an oxide coating on the wafer.

In one embodiment, the semiconductor wafer can contain silicon which reacts with the nitric oxide to form silicon oxynitride. The gas being fed to the thermal processing chamber can contain only dinitrogen oxide or can be a combination of dinitrogen oxide and molecular oxygen. For instance, in one embodiment, the gas can contain molecular oxygen in an amount up to about 50% by volume. In order to disassociate the dinitrogen oxide into nitric oxide, according the present invention, the gas should be preheated to a temperature of at least 800° C., and particularly from about 850° C. to about 1150° C., when operating near atmospheric pressure.

The gas reacting with the semiconductor wafer, according to the process of the present invention, can be preheated in a preheating device that is positioned either outside the thermal processing chamber or within the chamber. For instance, in one embodiment, a heated baffle can be placed within the thermal processing chamber for preheating the gas. The baffle, for example, can be a block of silicon carbide containing a plurality of passages for receiving the gas. The block of silicon carbide can be heated by the light energy that is used to also heat the semiconductor wafer.

In an alternative embodiment, the baffle can comprise a hollow liner contained within the thermal processing chamber for passing the gas therethrough. The hollow liner can also be heated by the light energy that is being supplied to the chamber. The liner can be made from a material that will increase in temperature when exposed to light energy, such as silicon carbide.

Preferably, after the gas has been preheated, according to the present invention, the gas is fed through a dispersing device and evenly dispersed over the surface of the semiconductor wafer. For instance, the gas can be fed through a perforated plate located above the wafer. The perforated plate can contain a plurality of holes through which the gas is directed prior to contacting the wafer.

Other objects, features, and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
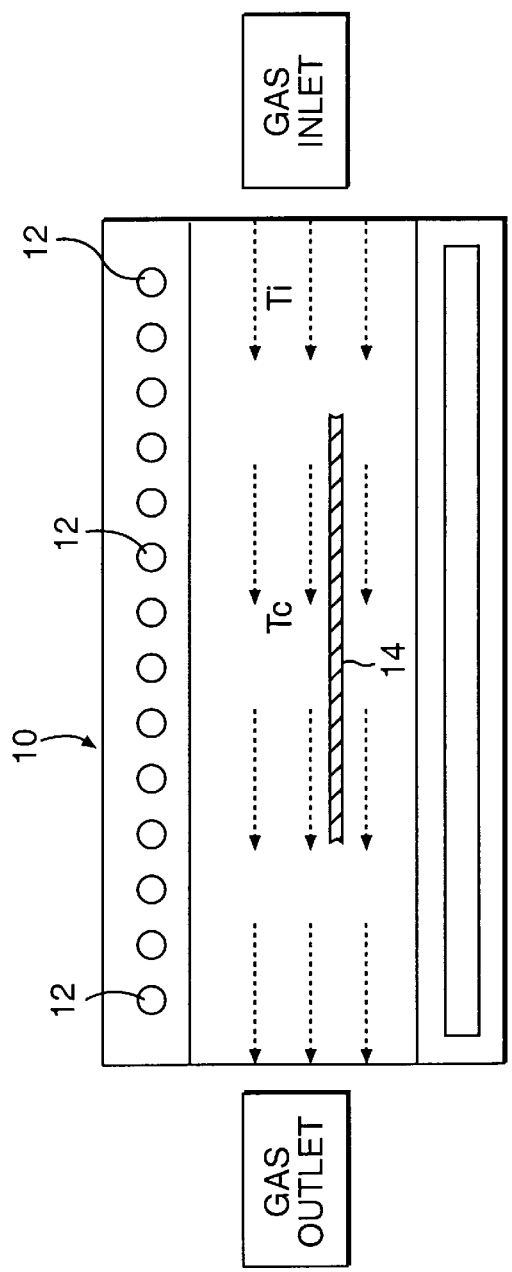
FIG. 1 is a diagrammatical cross sectional view of a prior art thermal processing chamber.

Repeat use of reference characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to a systematic process for coating semiconductor devices in a thermal processing chamber. The semiconductor devices are coated by reacting the devices with a gas or gases entering the thermal processing chamber. In accordance with the present invention, the gas entering the thermal processing chamber is preheated to a temperature sufficient for the gas to immediately react with the semiconductor device on contact.

For instance, in one embodiment of the present invention, an oxide coating is applied to a silicon wafer by reacting the wafer with a gas containing a nitric oxide. In this embodiment, the gas being fed to the thermal processing chamber initially contains dinitrogen oxide. According to the present invention, the gas, however, is preheated to a temperature sufficient to disassociate the dinitrogen oxide into nitric oxide. The nitric oxide is then uniformly dispersed over the surface of the wafer to promote the formation of a coating on the wafer with a constant thickness.

Because the gas is preheated prior to contacting the semiconductor wafer, the process of the present invention provides many benefits and advantages over prior art constructions. For instance, since the gas immediately reacts with the semiconductor device upon contact, the process proceeds at a relatively fast rate in comparison to conventional systems in which the gas is not preheated. Further, because the gas immediately reacts with the wafer, application of the coating to the wafer is more controlled and uniform.

Another benefit of the process of the present invention is that the preheated gas does not significantly affect the heating process of the wafer. In particular, since the gas is preheated, the wafer is not significantly cooled due to convective forces.

The process of the present invention is particularly well suited for use with thermal processing chambers that have "cold" walls, which refer to walls made from a nonconductive material. For instance, many thermal processing chambers are lined with quartz which does not significantly heat up during operation of the chamber. In these systems, a cold gas flowing through the chamber has a significantly greater adverse impact upon the heating process of the wafer in comparison to wafers heated in a chamber having walls that are thermally conductive. For example, when the walls of the chamber are made from a nonconductive material, the gas circulating through the chamber absorbs more thermal energy from the wafer, since the wafer is the only heated object within the chamber.

According to the present invention, the gas or gases being fed to the thermal processing chamber for reaction with the semiconductor wafer can be preheated in various ways. For instance, in one embodiment, prior to entering the thermal processing chamber, the gas can be fed through a preheating device. The preheating device can be, for instance, an electric heater, a heat exchanger, or any other suitable device capable of heating the gas to a temperature sufficient for reaction with the wafer contained with the chamber.

Besides preheating the gas or gases on the outside of the chamber, the gas can also be preheated within the interior of the thermal processing chamber. For instance, referring to FIG. 2, one embodiment of a method for preheating a gas within a thermal processing chamber generally (20) is illustrated.

As shown, thermal processing chamber (20) is adapted to receive a semiconductor wafer (22), for conducting various processes. In particular, thermal processing chamber (20) is designed to heat wafer (22) at very rapid rates and under carefully controlled conditions. Semiconductor wafers are loaded into and out of chamber (20) through a door (26).

Thermal processing chamber (20) can be made from various materials including metals and ceramics. In one embodiment of the present invention, as described above, chamber (20) includes interior walls made from a nonconductive material, such as quartz. For most applications, walls made from a nonconductive material such as quartz are preferred. For instance, metal walls can corrode when exposed to some of the gases that are fed through the chamber. Further, metal can leak and contaminate the chamber. Similar problems are not experienced with quartz walls. Further, quartz walls prevent condensation of high temperature steam.

As described above, the process of the present invention is particularly well suited for use in thermal processing chambers that have walls made from a nonconductive material. As shown, wafer (22) is positioned within thermal processing chamber (20) on a substrate holder (24). During processing, substrate holder (24), in one embodiment, can be adapted to rotate wafer (22). Rotating the wafer promotes greater temperature uniformity over the surface of the wafer and promotes enhanced contact between wafer (22) and the gas being circulated through the chamber. It should be understood, however, that besides wafers, thermal processing chamber (20) is also adapted to process optical parts, films, fibers, ribbons, and other substrates having any particular shape.

In order to heat wafer (22), the system of the present invention includes a heat source in communication with thermal processing chamber (20). In the embodiment illustrated, the heat source comprises a plurality of lamps (27), such as tungsten-halogen lamps. The lamps can be positioned above and below wafer (22) as shown in the figure, or can be placed only above or only below the wafer. Further, if desired, lamps (27) can be surrounded by a reflector or a set of reflectors for directing thermal energy being emitted by the lamps onto wafer (22) at particular locations. Besides being placed above and below wafer (22), lamps (27) may be positioned at any other location within the thermal processing chamber.

The use of lamps (27) as a heat source is generally preferred. For instance, lamps have much higher heating and cooling rates than other heating devices, such as electrical elements or conventional furnaces. Lamps (27) create a rapid thermal processing system that provides instantaneous energy, typically requiring a very short and well controlled startup period. The flow of energy from lamps (27) can also be abruptly stopped at any time. Lamps (27) can be equipped with a gradual power controller that can be used to increase or decrease the thermal energy being emitted by the lamps.

In order to monitor the temperature of wafer (22) during operation of thermal processing chamber (20), a radiation sensing device (28) is included. Radiation sensing device (28), which can be, for instance, a pyrometer, includes an optical fiber or light type (30) which extends from radiation sensing device (28) adjacent to wafer (22).

Light pipe (30) is configured to receive thermal energy being emitted by wafer (22) at a particular wavelength. The amount of sensed radiation is then communicated to radiation sensing device (28) which generates a usable voltage signal for determining the temperature of the wafer. In particular, by knowing the amount of thermal radiation being emitted by wafer (22) at a particular wavelength, the temperature of the object can be calculated based, in part, on Planck's Law.

During the process, light pipe (30) should only detect thermal radiation being emitted by wafer (22) and should be prevented from detecting thermal radiation being emitted by lamps (27) at the desired wavelength. In this regard, thermal processing chamber (12) includes spectral filters (32) and (34) which are positioned between lamps (27) and the end of light pipe (30). Spectral filters (32) and (34) are designed to filter out thermal radiation being emitted by lamps (27) which is at the wavelength at which radiation sensing device (28) operates. For instance, in one embodiment, spectral filters (32) and (34) can be made from fused silicon or quartz.

In accordance with the present invention, thermal processing chamber (20) further includes a gas inlet (38) and a gas outlet (40) for circulating one or more gases into the chamber. For instance, one or more gases can be introduced into thermal processing chamber (20) that are preheated in order to form a gaseous reactant which is designed to react with semiconductor wafer (22) for depositing a film or coating on the surface of the wafer. In the embodiment illustrated in FIG. 2, the gas or gases entering thermal processing chamber (20) are preheated within the chamber by a preheating device (44).

Figure 3:
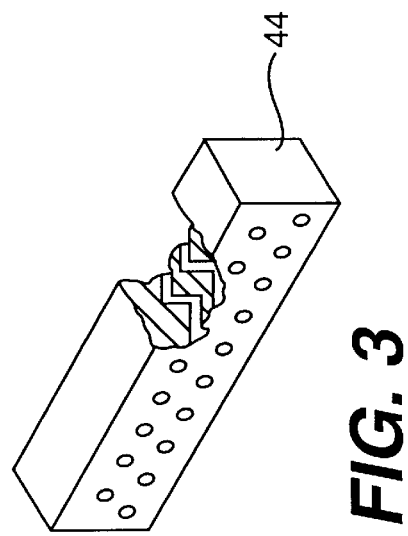
FIG. 3 is a perspective view with cutaway portions of one embodiment of a baffle for use in the present invention for preheating a gas being fed through a thermal processing chamber.

As more clearly shown in FIG. 3, preheating device (44) can be, for instance, a heated baffle. As shown, the heated baffle can contain a plurality of passages through which the gas is fed. In order to optimize heat transfer, the passages extending through baffle (44) can follow a labyrinthine path.

Although baffle (44) can be heated by electricity or other means, in the embodiment illustrated, the baffle is heated by lamps (27). As such, baffle (44) should be made from a material that will significantly increase in temperature when exposed to light energy. For example, baffle (44) can be made from silicon carbide, from graphite coated with silicon carbide or from a semiconductor grade quartz that will heat up when exposed to light energy. Besides the above materials, baffle (44) can also include an outer coating of an oxidation resistant material, such as a nitride coating, if desired. Using lamps (27) to heat baffle (44) is perhaps the most efficient manner for preheating the gas entering the chamber.

Alternatively, baffle (44) can be heated solely by electrical resistance or by a combination of electrical resistance and by absorbing light energy. If heated by electrical resistance, preferably the baffle is made from a material that is compatible with semiconductor processing applications. In particular, the baffle can be made from silicon, silicon carbide, graphite, or graphite coated with silicon carbide. All of these materials not only can be heated by electrical resistance to high temperatures but also have heating and cooling rates that are well suited for use in thermal processing chambers. If the baffle is positioned outside of the chamber, however, then it may be appropriate to use other conductive materials, such as metals.

Figure 2:
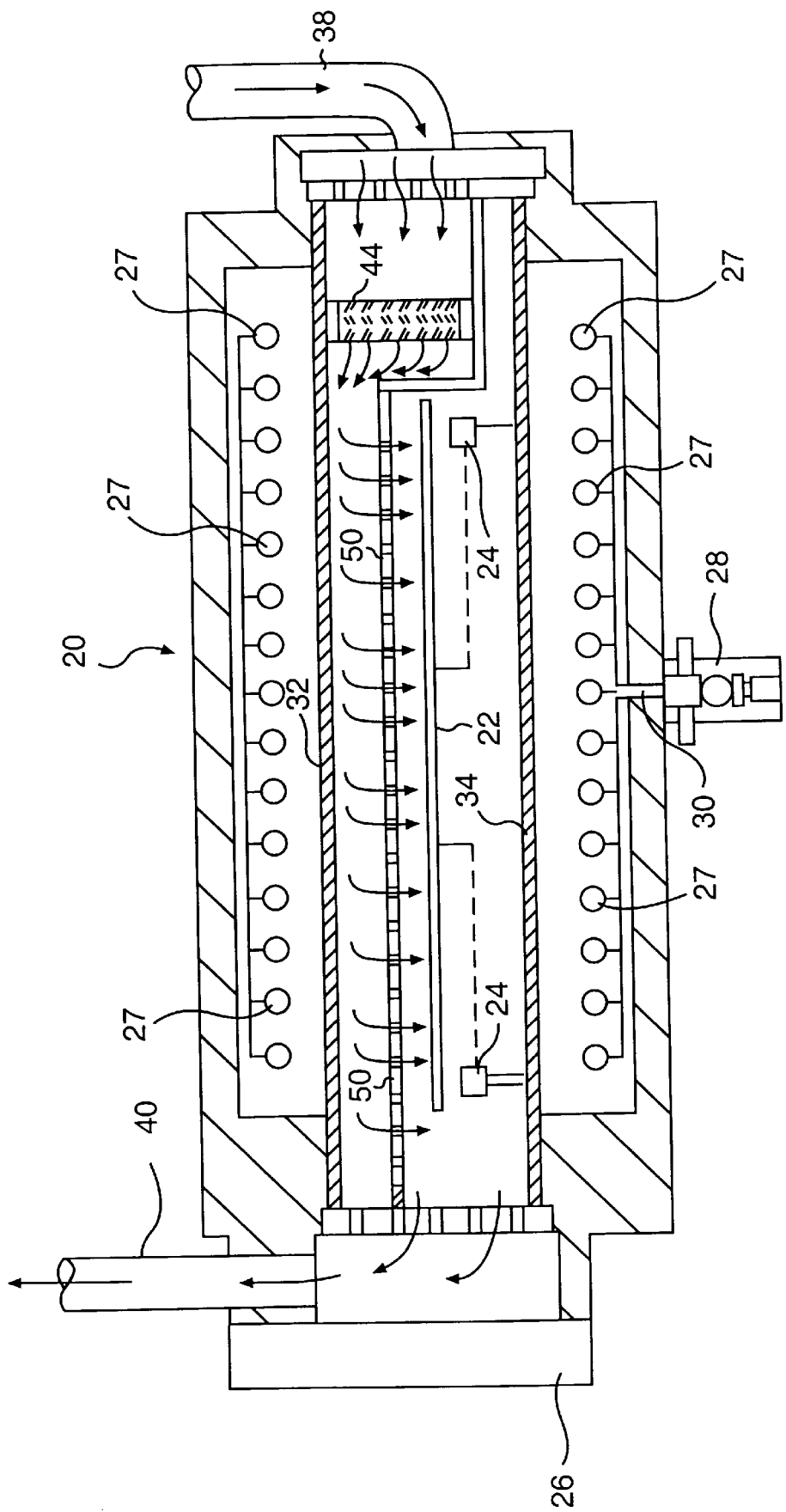
FIG. 2 is a cross sectional view of a thermal processing chamber illustrating one embodiment of the process of the present invention.

Besides being positioned along the side of thermal processing chamber (20) as shown in FIG. 2, baffle (44) may be placed anywhere within the chamber so that there is sufficient contact with the light energy being emitted by lamps (27). Further, baffle (44) may take many different forms and shapes besides the block configuration illustrated in FIG. 3. For instance, in an alternative embodiment, baffle (44) can comprise a hollow liner located around the inside perimeter of thermal processing chamber (20). The hollow liner can have walls made from a material that will substantially increase in temperature when exposed to light energy, such as silicon carbide. In this embodiment, when the gas enters the chamber, the gas will flow through the hollow liner and become heated prior to contacting semiconductor wafer (22). For example, in one preferred embodiment, the hollow liner will extend up a side of the chamber and then will form a channel either above or below semiconductor wafer (22) where the gas is released onto the wafer.

Prior to contacting semiconductor wafer (22), the gas or gases should be preheated by the preheating device to a temperature so the gas can immediately react with the wafer upon contact. This temperature will generally depend upon the gas being fed to the chamber and the desired reaction that is to occur. For instance, in one embodiment, the gas entering the thermal processing chamber can be preheated to a temperature so that the gas disassociates in order to form a gaseous reactant which will react with the semiconductor wafer. In an alternative embodiment, more than one gas can be fed through the chamber which are preheated to a temperature sufficient for the gases to react with each other in order to form the gaseous reactant.

In one preferred embodiment of the present invention, the gas entering the thermal processing chamber contains dinitrogen oxide which is used to ultimately apply an oxide coating to the semiconductor wafer. The process for applying an oxide film on a silicon wafer using dinitrogen oxide gas can be represented as follows.

First, the dinitrogen oxide is heated until it forms nitric oxide (NO$^+$).

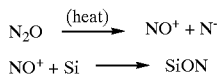

Once nitric oxide is formed, the nitric oxide can react with silicon in the wafer to form silicon oxynitride. Consequently, in this embodiment, the dinitrogen oxide should be preheated to a temperature sufficient to cause substantially all of the dinitrogen oxide to form nitric oxide prior to contact with the wafer.

In most applications, when thermal processing chamber (20) operates at or near atmospheric pressure, the gas containing dinitrogen oxide should be preheated to a temperature of at least 800° C. in order for nitric oxide to form.

More particularly, the gas should be heated to a temperature of from about 850° C. to about 1150° C. It has been discovered that if the gas is not heated to at least 800° C., the dinitrogen oxide, instead of disassociating into nitric oxide, may form molecular nitrogen according to the following formula:

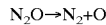

Although molecular nitrogen will not adversely affect the process, the formation of molecular nitrogen will decrease the rate at which the oxide coating is formed and will require greater amounts of gas in order to form the coating. As such, according to the present invention, preferably the dinitrogen oxide is preheated to a temperature so that significant amounts of molecular nitrogen are not formed.

The length of time that it will take to preheat the gas entering the thermal processing chamber will depend upon a number of factors. For instance, the time it will take to preheat the gas to its reactive temperature will depend upon the initial temperature of the gas, the temperature of semiconductor wafer (22), and the gas flow rate. For most applications, when applying an oxide coating to a semiconductor wafer having a diameter of about 8", the flow rate of the gas entering the chamber can be from about 1 liter/minute to about 10 liters/minute, and particularly from about 4 liters/minute to about 6 liters/minute.

Preferably, the gas should be preheated as close as possible to semiconductor device (22), so that the gas does not have time to cool prior to contacting the wafer. Further, in one preferred embodiment, the gas is uniformly dispersed over the surface of the wafer after being preheated. For instance, thermal processing chamber (20) can include a dispersing device that directs and disperses the gas over the surface of the wafer where reaction is intended to occur. For example, as shown in FIG. 2, in one embodiment, a perforated plate (50) is positioned over the top surface of semiconductor wafer (22). Perforated plate (50) includes a plurality of holes through which the gas is directed prior to contacting the wafer. By distributing the gas evenly over the wafer surface, the process produces a film having a more uniform thickness and promotes a uniform temperature distribution throughout the wafer.

It should be understood, however, that the perforated plate (50) is optional. Thus, in one embodiment, the gas or gases being fed to the chamber can immediately contact wafer (22) after being preheated by baffle (44).

As described above, one preferred embodiment of the present invention is directed to the use of a gas containing dinitrogen oxide that is preheated and contacted with a semiconductor wafer in order a form an oxide coating on the wafer. In this embodiment, the gas entering the chamber can be pure dinitrogen oxide or can contain a mixture of dinitrogen oxide and molecular oxygen. For example, molecular oxygen can be present within the gas in an amount up to about 50% by volume, and particularly in an amount of up to about 30% by volume. When present, molecular oxygen may increase the growth rate of the oxide film being formed on the wafer.

In an alternative embodiment, pure molecular oxygen can be first preheated and contacted with the semiconductor wafer followed by contact with nitric oxide derived from dinitrogen oxide. In this embodiment, the molecular oxygen reacts with silicon contained within the wafer to form silicon dioxide. The wafer is then contacted with nitric oxide to form silicon oxynitride as described above.

It should be understood, however, that the use of dinitrogen oxide in the process of the present invention as described above represents just one embodiment of the present invention. In this regard, it is believed that the process of the present invention is also particularly well suited to forming other types of coatings and films on semiconductor devices. In general terms, the present invention is directed to preheating one or more gases to a reactive temperature in order to from a gaseous reactant and then uniformly dispersing the gaseous reactant over the surface of the wafer.

For instance, in one alternative embodiment of the present invention, molecular hydrogen and molecular oxygen can be fed to the thermal processing chamber and preheated in accordance with the present invention. In particular, the gases are preheated to a temperature sufficient for the gases to react and form steam. Once formed, the steam is then dispersed over the wafer in order to form an oxide coating on the wafer. In the past, steam has been generated in thermal processing chambers using the heat being emitted by the wafer. Preheating the hydrogen gas and the oxygen gas to form steam prior to contacting the wafer, however, provides better control over the coating thickness and uniformity.

When the preheating device of the present invention is used to form steam, hydrogen and oxygen can be fed to the thermal processing chamber in stoichiometric amounts. In particular, for every mole of oxygen that is fed to the chamber, two moles of hydrogen can be fed to the chamber. Either component, however, may be added in excess if desired.

In this embodiment, the hydrogen and oxygen gases should be preheated according to the process of the present invention to a temperature sufficient to form steam but to a temperature that would be insufficient to cause any combustion.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A process for forming an oxynitride coating on a semiconductor device, said process comprising the steps of:
   placing a semiconductor wafer in a thermal processing chamber;
   heating said semiconductor wafer using light energy;
   preheating a gas containing dinitrogen oxide remote from said semiconductor wafer, said gas being preheated to a temperature sufficient to convert a substantial portion of said dinitrogen oxide into nitric oxide; and
   contacting said preheated gas with said semiconductor wafer while said wafer is being heated by said light energy, said nitric oxide reacting with said semiconductor wafer to form an oxide coating on said wafer.

2. A process as defined in claim 1, wherein said semiconductor wafer comprises a silicon wafer and wherein said nitric oxide reacts with said silicon wafer to form silicon oxynitride.

3. A process as defined in claim 1, wherein said gas is preheated within said thermal processing chamber.

4. A process as defined in claim 1, wherein said preheated gas is fed through a perforated plate prior to contacting said semiconductor wafer, said perforated plate distributing said gas over a surface of said wafer.

5. A process as defined in claim 1, wherein said gas is preheated to a temperature of at least 800° C.

6. A process as defined in claim 1, wherein said gas is preheated to a temperature of from about 850° C. to about 1150° C.

7. A process as defined in claim 1, wherein said gas is preheated by being fed through a heated baffle contained within said thermal processing chamber, said baffle being heated by light energy.

8. A process as defined in claim 1, wherein said gas further contains molecular oxygen.

9. A process as defined in claim 1, wherein said semiconductor wafer is first contacted with a preheated gas containing molecular oxygen prior to being contacted with said preheated gas containing nitric oxide.

10. A process as defined in claim 1, wherein said thermal processing chamber is surrounded by walls made from a substantially nonconductive material, and wherein said thermal processing chamber is in communication with a plurality of light sources for providing light energy to said chamber.

11. A process for forming an oxynitride coating on a semiconductor device, said process comprising the steps of:
    placing a silicon wafer in a thermal processing chamber, said thermal processing chamber being in communication with at least one light source;
    heating said semiconductor wafer within said thermal processing chamber using light energy being emitted by said at least one light source;
    preheating a gas containing dinitrogen oxide remote from said semiconductor wafer, said gas being preheated to a temperature sufficient to convert a substantial portion of said dinitrogen oxide into nitric oxide;
    dispersing said preheated gas over a surface of said silicon wafer; and
    reacting said nitric oxide contained within said preheated gas with said surface of said silicon wafer to form a silicon oxynitride coating on said surface of said wafer, said wafer being reacted with said nitric oxide while said wafer is being heated within said thermal processing chamber.

12. A process as defined in claim 11, wherein said gas is preheated to a temperature of at least 800° C.

13. A process as defined in claim 11, wherein said thermal processing chamber includes interior walls that are substantially thermally nonconductive.

14. A process as defined in claim 11, wherein said gas only comprises dinitrogen oxide.

15. A process as defined in claim 11, wherein said gas comprises of a mixture of dinitrogen oxide and molecular oxygen, said molecular oxygen being present within said gas in an amount up to about 50% by volume.

16. A process as defined in claim 11, wherein said gas is preheated by being fed through a heated baffle contained within said thermal processing chamber.

17. A process as defined in claim 16, wherein said heated baffle comprises a silicon carbide block containing a plurality of passages for receiving said gas, said silicon carbide block being positioned within said thermal processing chamber so as to be heated by said at least one light source.

18. A process as defined in claim 16, wherein said heated baffle comprises a hollow lining contained within said thermal processing chamber through which said gas is circulated, said gas being preheated within said lining by said at least one light source.

19. A process as defined in claim 11, wherein said gas is dispersed by being fed through a perforated plate located above said silicon wafer.

20. A process for forming a coating on a semiconductor device by reacting said device with a gas, said process comprising the steps of:

placing a semiconductor device in a thermal processing chamber, said thermal processing chamber including interior walls made from a substantially nonconductive material, said thermal processing chamber being in communication with at least one light source;

heating said semiconductor device within said thermal processing chamber using light energy being emitted said at least one light source;

preheating a gas being fed to said thermal processing chamber remote from said semiconductor device, said gas being preheated using essentially thermal energy, said gas being preheated to a temperature sufficient for at least one component contained within said gas to undergo a chemical change and form a gaseous chemical reactant; and contacting said semiconductor device with said preheated gas while said semiconductor device is being heated by said at least one light source, said gaseous chemical reactant reacting with said semiconductor device to form a coating on said device.

21. A process as defined in claim 20, wherein said gas is preheated by being fed through a heated baffle contained within said thermal processing chamber, said baffle being heated by light energy being emitted by said at least one light source.

22. A process as defined in claim 21, wherein said preheated gas is directed through a perforated plate positioned above said semiconductor device prior to said gas contacting said device, said perforated plate uniformly distributing said gas over the surface of said semiconductor device.

23. A process as defined in claim 20, wherein said gas contains dinitrogen oxide and wherein said dinitrogen oxide is converted into nitric oxide when said gas is preheated.

24. A process as defined in claim 20, wherein said interior walls of said thermal processing chamber are made from quartz.

25. A process as defined in claim 20, wherein said gas contains hydrogen and oxygen, and wherein said hydrogen and oxygen form steam when said gas is preheated.

26. A process as defined in claim 21, wherein said heated baffle comprises a hollow lining contained within said thermal processing chamber through which said gas is circulated.

27. A process as defined in claim 21, wherein said heated baffle comprises a silicon carbide block containing a plurality of passages for receiving said gas.

28. A process as defined in claim 20, wherein said gas is preheated by light energy being emitted by said at least one light source.

29. A process as defined in claim 20, wherein said gas is preheated by an electrical resistance heater.

* * * * *